United States Patent
Xu et al.

(10) Patent No.: US 9,991,348 B2
(45) Date of Patent: Jun. 5, 2018

(54) ARRAY SUBSTRATE WITH REDUCED FLICKERING, METHOD FOR MANUFACTURING THE SAME AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhuo Xu, Beijing (CN); Jaikwang Kim, Beijing (CN); Rui Wang, Beijing (CN); Yajie Bai, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days. days.

(21) Appl. No.: 15/305,826

(22) PCT Filed: Feb. 15, 2016

(86) PCT No.: PCT/CN2016/073794
§ 371 (c)(1),
(2) Date: Oct. 21, 2016

(87) PCT Pub. No.: WO2017/049848
PCT Pub. Date: Mar. 30, 2017

(65) Prior Publication Data
US 2017/0271461 A1    Sep. 21, 2017

(30) Foreign Application Priority Data
Sep. 24, 2015    (CN) .......................... 2015 1 0612449

(51) Int. Cl.
| | | |
|---|---|---|
| *H01L 29/417* | (2006.01) | |
| *H01L 27/12* | (2006.01) | |
| *G02F 1/1368* | (2006.01) | |
| *G02F 1/1362* | (2006.01) | |

(Continued)

(52) U.S. Cl.
CPC ...... *H01L 29/41733* (2013.01); *G02F 1/1368* (2013.01); *G02F 1/134309* (2013.01);
(Continued)

(58) Field of Classification Search
CPC ............. H01L 29/41733; H01L 27/124; H01L 27/1259; G02F 1/134309; G02F 1/1368;
(Continued)

(56) References Cited

U.S. PATENT DOCUMENTS

| | | | |
|---|---|---|---|
| 5,097,297 A | 3/1992 | Nakazawa | |
| 6,801,266 B1 * | 10/2004 | Tsujimura | ......... G02F 1/136209 349/42 |

(Continued)

FOREIGN PATENT DOCUMENTS

| | | |
|---|---|---|
| CN | 201000520 Y | 1/2008 |
| CN | 102054832 A | 5/2011 |

(Continued)

OTHER PUBLICATIONS

First Office Action for Chinese Application No. 201510612449.8, dated Jul. 3, 2017, 7 Pages.

(Continued)

*Primary Examiner* — Selim Ahmed
(74) *Attorney, Agent, or Firm* — Brooks Kushman P.C.

(57) ABSTRACT

An array substrate includes a gate electrode and a source electrode arranged on a base substrate of the array substrate. The source electrode has a first end connected to a pixel electrode on the array substrate, and a second end opposite to the first end. A tip of the second end is provided with an extension portion, and an orthogonal projection of the exten- (Continued)

sion portion onto the base substrate extends beyond an orthogonal projection of the gate electrode onto the base substrate.

11 Claims, 4 Drawing Sheets

(51) Int. Cl.
*G02F 1/1343* (2006.01)
*G09G 3/36* (2006.01)

(52) U.S. Cl.
CPC ...... *G02F 1/136286* (2013.01); *H01L 27/124* (2013.01); *H01L 27/1259* (2013.01); *G02F 2201/123* (2013.01); *G02F 2201/40* (2013.01); *G09G 3/3648* (2013.01); *G09G 2300/043* (2013.01); *G09G 2320/0247* (2013.01)

(58) Field of Classification Search
CPC ........... G02F 1/136286; G02F 2201/40; G02F 2201/123; G09G 3/3648; G09G 2320/0247; G09G 2300/043
See application file for complete search history.

(56) References Cited

U.S. PATENT DOCUMENTS

| | | | |
|---|---|---|---|
| 2004/0105041 | A1 | 6/2004 | Tsujimura et al. |
| 2007/0229723 | A1 | 10/2007 | Huang |
| 2009/0207115 | A1* | 8/2009 | Kim .................... G02F 1/13624 345/90 |

FOREIGN PATENT DOCUMENTS

| | | |
|---|---|---|
| CN | 104393004 A | 3/2015 |
| CN | 105140243 A | 12/2015 |
| TW | I293802 B | 2/2008 |

OTHER PUBLICATIONS

International Search Report and Written Opinion for Application No. PCT/CN2016/073794, dated Jun. 24, 2016, 8 Pages.
Second Office Action for Chinese Application No. 201510612449.8, dated Feb. 11, 2018, 7 Pages.

* cited by examiner

ARRAY SUBSTRATE WITH REDUCED FLICKERING, METHOD FOR MANUFACTURING THE SAME AND DISPLAY DEVICE

CROSS-REFERENCE TO RELATED APPLICATIONS

This application is the U.S. national phase of PCT Application No. PCT/CN2016/073794 filed on Feb. 15, 2016, which claims priority to Chinese Patent Application No. 201510612449.8 filed on Sep. 24, 2015, the disclosures of which are incorporated in their entirety by reference herein.

TECHNICAL FIELD

The present disclosure relates to the field of display technology, in particular to an array substrate, a method for manufacturing the same, and a display device.

BACKGROUND

A capacitance Cgs may be generated between a gate electrode and a source electrode of a thin film transistor (TFT), and a potential at a pixel may be pulled down due to a potential at the gate electrode. During the manufacture of the TFT, an overlapping offset may easily occur between a gate layer and a source/drain (SD) layer, and it is impossible for a conventional TFT design to ensure a constant Cgs. In addition, the larger the Cgs is, the larger the potential ($\Delta V p$) at the pixel to be pulled down is, and the larger a grayscale difference formed by an identical signal voltage in the case of polarity conversion is. At this time, such a phenomenon as flickering may occur for an image. Hence, an additional scheme for compensating for the Cgs needs to be provided. The Cgs compensation design has been widely applied in the pixel design for a thin film transistor liquid crystal display (TFT-LCD), and it is mainly used to ensure a stable Cgs and prevent the occurrence of such display defects as flickering.

Generally, it is able to compensate for $\Delta V p$ merely by adjusting a potential at a common electrode (COM) to be a median value of the signal voltage. However, in the case that a Cgs difference occurs for an identical batch of products, it is difficult to compensate for the potential at the common electrode, and thereby a display effect of the products may be adversely affected. Hence, it is impossible for this Cgs compensation scheme to achieve an ideal effect.

Hence, there is an urgent need to provide a scheme, so as to prevent the occurrence of such display defects as flickering for the TFT-LCD, due to the unstable capacitance Cgs generated between the gate electrode and the source electrode of a TFT.

SUMMARY

(1) Technical Problem to be Solved

A main object of the present disclosure is to provide a Cgs compensation scheme, so as to ensure a stable Cgs and prevent the occurrence of such display defects as flickering, without increasing a load of a gate line or reducing an aperture ratio of a pixel.

(2) Technical Solution

In one aspect, the present disclosure provides in some embodiments an array substrate, including a gate electrode and a source electrode arranged on a base substrate of the array substrate. The source electrode has a first end connected to a pixel electrode on the array substrate, and a second end opposite to the first end. A tip of the second end is provided with an extension portion, and an orthogonal projection of the extension portion onto the base substrate extends beyond an orthogonal projection of the gate electrode onto the base substrate.

Optionally, the source electrode is of a strip-like shape.

Optionally, the extension portion has a length within a range from 1 µm to 5 µm.

Optionally, the extension portion has a length of 1.5 µm.

Optionally, the source electrode extends in a direction substantially parallel to a data line connected to a TFT on the array substrate.

Optionally, the array substrate further includes a drain electrode formed at a layer identical to the source electrode and the data line, the drain electrode is connected to, and extends in a direction substantially identical to, the data line, and the source electrode extends in a direction substantially parallel to the drain electrode.

Optionally, the source electrode extends in a direction substantially perpendicular to a data line connected to a TFT on the array substrate.

Optionally, the array substrate further includes a drain electrode formed at a layer identical to the source electrode and the data line, the drain electrode is connected to, and extends in a direction substantially perpendicular to, the data line, and the source electrode extends in a direction substantially parallel to the drain electrode.

Optionally, the extension portion has a width substantially identical to a width of the source electrode.

In another aspect, the present disclosure provides in some embodiments a display device including the above-mentioned array substrate.

In yet another aspect, the present disclosure provides in some embodiments a method for manufacturing an array substrate, including steps of: forming a gate electrode on a base substrate; and forming a source electrode provided with an extension portion on the gate electrode. The source electrode has a first end connected to a pixel electrode and a second end opposite to the first end. The extension portion is provided at a tip of the second end, and an orthogonal projection of the extension portion onto the base substrate extends beyond an orthogonal projection of the gate electrode onto the base substrate.

Optionally, the step of forming the source electrode provided with the extension portion includes forming a drain electrode, a data line connected to, and extending in a direction substantially identical to, the drain electrode, and the source electrode at an identical layer. The extension portion is provided at the second end of the source electrode, and the source electrode extends in a direction substantially parallel to the data line.

Optionally, the step of forming the source electrode provided with the extension portion includes forming a drain electrode, a data line connected to, and extending in a direction substantially perpendicular to, the drain electrode, and the source electrode at an identical layer. The extension portion is provided at the second end of the source electrode, and the source electrode extends in a direction substantially perpendicular to the data line.

Optionally, the extension portion has a length within a range from 1 μm to 5 μm.

Optionally, the extension portion has a length of 1.5 μm.

(3) Beneficial Effect

According to the array substrate, its manufacturing method and the display device in the embodiments of the present disclosure, as compared with the related art, it is able to provide a stable capacitance Cgs between the gate electrode and the source electrode of a TFT, a stable potential at a pixel to be pulled down, and a stable grayscale difference formed by a signal voltage in the case of polarity conversion, without increasing a load of a gate line or reducing an aperture ratio of the pixel.

BRIEF DESCRIPTION OF THE DRAWINGS

In order to illustrate the technical solutions in the embodiments of the present disclosure or the related art in a clearer manner, the drawings desired for the present disclosure or the related art will be described briefly hereinafter. Obviously, the following drawings merely relate to parts of the embodiments of the present disclosure, and a person skilled in the art may, without any creative effort, acquire the other drawings based on these drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
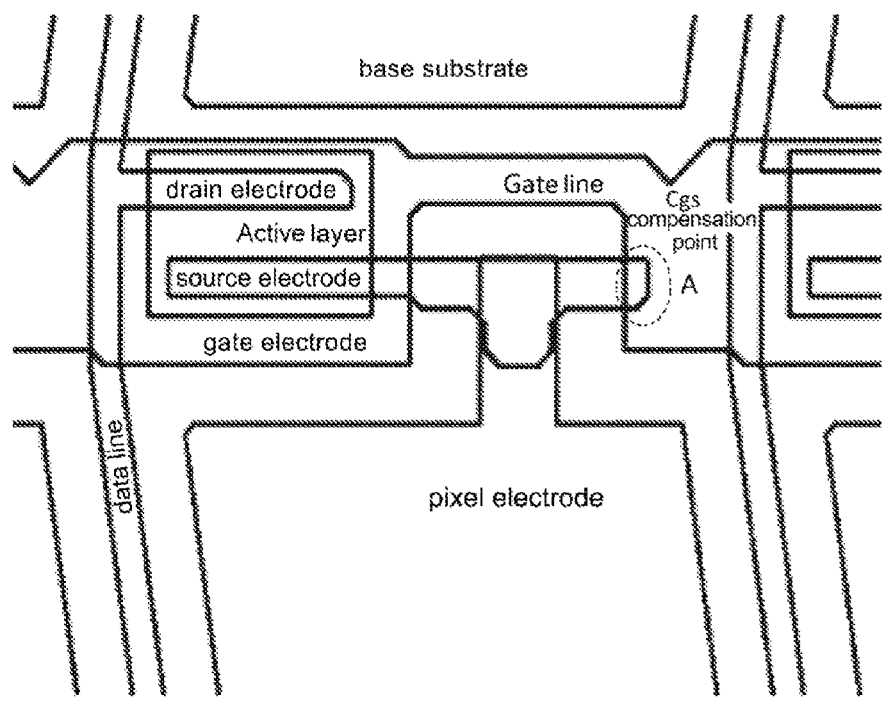
FIG. 1 is a schematic view showing a positive Cgs compensation scheme in the related art.

In the related art, for a TFT-LCD, an unstable capacitance Cgs may be generated between a gate electrode and a drain electrode of a TFT, and such display defects as flickering may easily occur. Apart from compensating for the Cgs by adjusting a potential at a common electrode, some other Cgs compensation schemes have also be proposed. For example, as a conventional Cgs compensation scheme, also called as positive Cgs compensation scheme, one end of a source (S) electrode of a TFT connected to a pixel may be extended, so as to achieve an overlapping offset between the source electrode and the gate electrode of a TFT. FIG. 1 shows the positive Cgs compensation scheme in the related art. Although it is able for the positive Cgs compensation scheme to ensure the stable capacitance Cgs, a value of the capacitance Cgs may increase, and as a result, a load of a gate line may increase and an aperture ratio of the pixel may decrease.

In this regard, the present disclosure provides in some embodiments a different Cgs compensation scheme, also called as negative Cgs compensation scheme, so as to prevent the load of the gate line from increasing and prevent the aperture ratio of the pixel from decreasing.

The present disclosure provides in some embodiments an array substrate, which includes a gate electrode and a source electrode arranged on a base substrate of the array substrate. The source electrode has a first end connected to a pixel electrode on the array substrate, and a second end opposite to the first end. A tip of the second end is provided with an extension portion, and an orthogonal projection of the extension portion onto the base substrate extends beyond an orthogonal projection of the gate electrode onto the base substrate, i.e., the extension portion overlaps the gate electrode in an orthogonal direction.

It is found that, in the embodiments of the present disclosure, one end of the source electrode opposite to the other end connected to the pixel electrode may be extended, so as to provide the extension portion. Through a supplementary capacitor structure formed between the extension portion and the gate electrode, it is able to provide a more stable capacitance Cgs between the gate electrode and the source electrode.

In the embodiments of the present disclosure, the source electrode may be of a strip-like shape (i.e., a shape corresponding to an I-type TFT channel). In other words, the source (S) electrode of the TFT may extend along the I-type TFT channel in such a manner that the tip of the source electrode extends beyond the gate electrode, so as to form a compensation point (the supplementary capacitor) without any overlapping region, thereby to achieve the negative Cgs compensation design. In this way, the value of the capacitance Cgs and the load of the gate line may not increase, and meanwhile the aperture ratio of the pixel may not be adversely affected.

In some embodiments of the present disclosure, in order to provide a more stable Cgs and minimize the influence on the load of the gate line and the aperture ratio of the pixel, the extension portion may have a length within a range from 1 μm to 5 μm. In other words, through selecting the length of the extension portion with the mentioned range, it is able to provide a more stable capacitance Cgs.

Of course, during the actual design, the extension portion may have a length of 1.5 μm, and this value is determined through multiple experiments.

Figure 2:
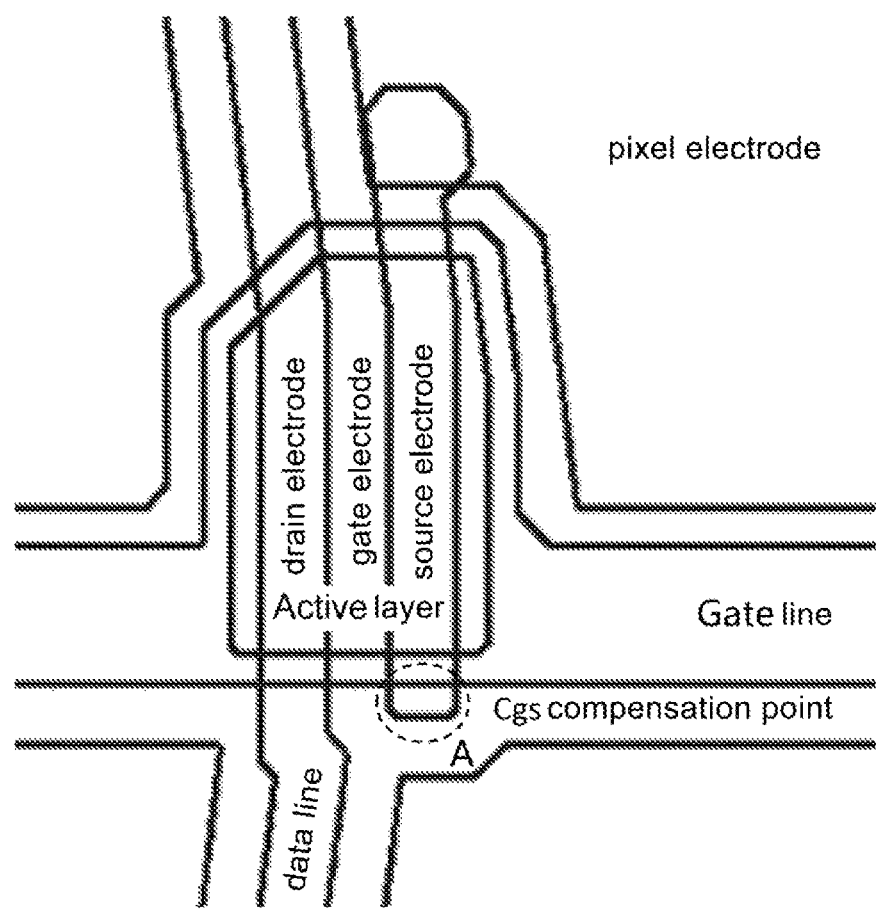
FIG. 2 is a schematic view showing a negative Cgs compensation scheme in the case that a source electrode on an array substrate extends parallel to a data line according to one embodiment of the present disclosure.

In the embodiments of the present disclosure, the source electrode may extend in a direction substantially parallel to a data line connected to the TFT. Referring to FIG. 2, which is a schematic view showing the negative Cgs compensation design in the case that the source electrode on the array substrate extends in a direction substantially parallel to the data line, the array substrate may further include a drain electrode formed at a layer identical to the source electrode and the data line. The drain electrode may be connected to, and extend in a direction substantially identical to, the data line, so the source electrode may extend in a direction substantially parallel to the drain electrode. At this time, the extension portion may also extend in a direction substantially parallel to the data line. In this way, a Cgs compensation point, i.e., region A in FIG. 2, may be formed between the extension portion and the gate electrode in the orthogonal direction.

Taking a high aperture ratio-advanced super dimension switch (HADS) product as an example, the I-type (strip-like) source electrode may be arranged in a direction substantially parallel to the data line, and a tip of the source electrode may extend beyond a gate layer by 1 μm to 5 μm. In the case that there is a certain overlapping region between a source-drain (SD) layer and the gate layer in a direction X (a direction substantially perpendicular to the data line) or a direction Y (a direction of the data line), the overlapping region between the SD layer and the gate electrode on the gate layer may have a constant area, so the capacitance Cgs of the TFT may have a constant value. As a result, it is able to achieve the Cgs compensation.

In the case that liquid crystal molecules are aligned through a rubbing process, a rubbing direction of the HADS product may be substantially parallel to an extension direction of the source electrode. At this time, a relatively small portion of a rubbing area may be shielded by the TFT, and as compared with the situation where the TFT is arranged in a direction transverse to the rubbing direction, it is able to effectively reduce an area of a weak rubbing region.

Figure 3:
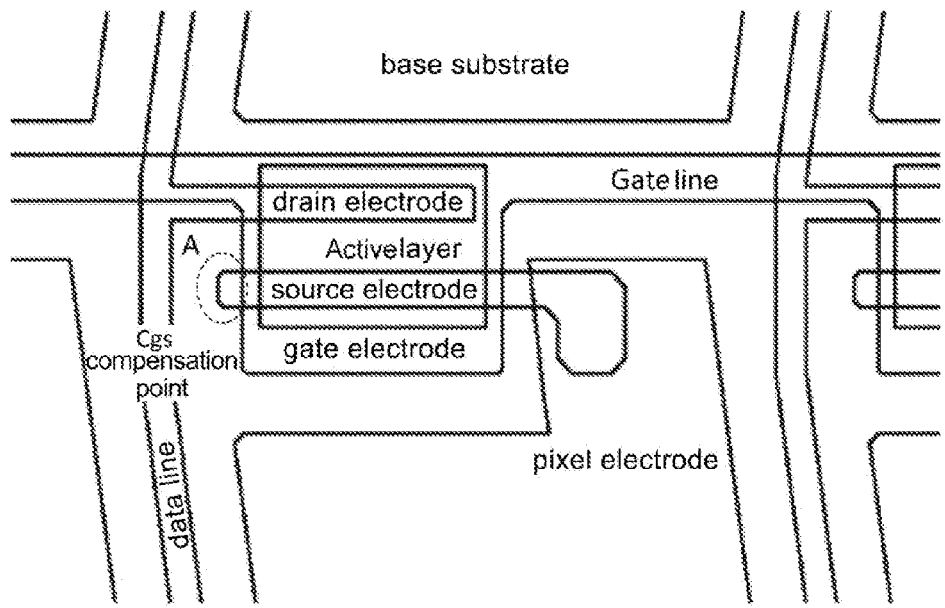
FIG. 3 is another schematic view showing the negative Cgs compensation scheme in the case that the source electrode on the array substrate extends perpendicular to the data line according to one embodiment of the present disclosure.

In some other embodiments of the present disclosure, the source electrode may also extend in a direction substantially perpendicular to the data line connected to the TFT. Referring to FIG. 3, which is another schematic view showing the negative Cgs compensation design in the case that the source electrode on the array substrate extends in a direction substantially perpendicular to the data line, the array substrate may further include a drain electrode formed at a layer identical to the source electrode and the data line. The drain electrode may be connected to, and extends in a direction substantially perpendicular to, the data line, and the source electrode may extend in a direction substantially parallel to the drain electrode, so the source electrode may extend in a direction substantially perpendicular to the date line. At this time, the extension portion may also extend in a direction substantially perpendicular to the data line, and a Cgs compensation point, i.e., region A in FIG. 3, may be formed between the extension portion and the gate electrode in the orthogonal direction.

Taking the HADS product as an example, the I-type (strip-like) source electrode may be arranged in a direction substantially perpendicular to the data line, and a tip of the source electrode may extend beyond the gate layer by 1 μm to 5 μm. In the case that there is a certain overlapping region between a source-drain (SD) layer and the gate layer in the direction X (a direction substantially perpendicular to the data line) or the direction Y (a direction of the data line), the overlapping region between the SD layer and the gate electrode on the gate layer may have a constant area, so the capacitance Cgs of the TFT may have a constant value.

As compared with the positive Cgs compensation scheme in the related art, it is able for the negative Cgs compensation scheme in FIG. 2 or 3 to increase the aperture ratio from 72.8% to 74.5%, i.e., by about 1.7%. In addition, through the negative Cgs compensation scheme, it is able to remarkably reduce the overlapping region between the SD layer and the gate layer. Further, a capacitance Cdg for a single pixel may be reduced from 17.5 fF to 12.7 fF, i.e., by about 27.4%, and a total load capacitance (144 fF) for the data line connected to a single pixel may be reduced by about 3.3%.

In order to provide a more stable capacitance Cgs, the extension portion in FIG. 2 or 3 may have a length of 1.5 μm, and this value is determined through multiple experiments. A width of the extension portion may be determined in accordance with the practical need. Of course, in order to simplify the process and facilitate the calculation or adjustment of the value of Cgs, in some embodiments of the present disclosure, the width of the extension portion may be substantially identical to that of the source electrode. In other words, during the actual design, the width of the extension portion may be identical to that of the source electrode, so as to prevent a wiring space from being adversely affected in the case of a too large width, or prevent the Cgs compensation effect from being adversely affected in the case of a too small width.

Based on the above, the present disclosure further provides in some embodiments a display device including the above-mentioned array substrate. The display device may be any product or member having a display function, such as a mobile phone, a flat-panel computer, a television, a display, a laptop computer, a digital photo frame or a navigator. The primary improvement of the display device lies in the above-mentioned negative Cgs compensation scheme, so the structure of the display device will not be particularly defined herein.

Figure 4:
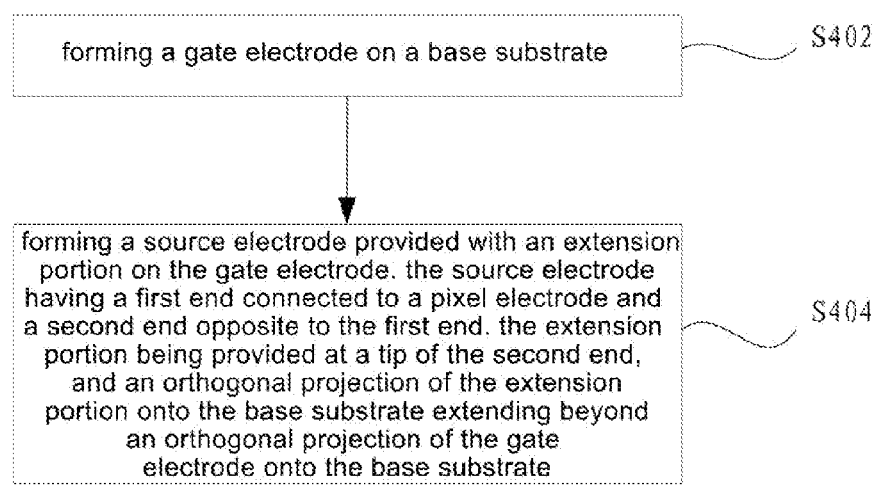
FIG. 4 is a flow chart of a method for manufacturing the array substrate according to one embodiment of the present disclosure.

The present disclosure further provides in some embodiments a method for manufacturing the above-mentioned array substrate. As shown in FIG. 4, the method may include: Step S402 of forming the gate electrode on the base substrate; and Step S404 of forming the source electrode provided with the extension portion on the gate electrode. The source electrode has a first end connected to a pixel electrode and a second end opposite to the first end. The extension portion is provided at a tip of the second end, and an orthogonal projection of the extension portion onto the base substrate extends beyond an orthogonal projection of the gate electrode onto the base substrate.

In Step S404, the source electrode provided with the extension portion may be formed in the following two modes.

Mode 1: the drain electrode, the data line connected to, and extending in a direction substantially identical to, the drain electrode, and the source electrode may be formed at an identical layer. The extension portion may be provided at the second end of the source electrode, and the source electrode may extend in a direction substantially parallel to the data line.

Mode 2: the drain electrode, the data line connected to, and extending in a direction substantially perpendicular to, the drain electrode, and the source electrode may be formed at an identical layer. The extension portion may be provided at the second end of the source electrode, and the source electrode may extend in a direction substantially perpendicular to the data line.

In the embodiments of the present disclosure, the extension portion may have a length within a range from 1 μm to 5 μm. Of course, in order to provide a more stable Cgs and minimize the influence on the load of the gate line and the aperture ratio of the pixel, the extension portion may have a length of 1.5 μm.

In a word, in the embodiments of the present disclosure, the tip of the source electrode of the TFT may extend beyond the gate electrode, so as to form the extension portion having a length within the range from 1 μm to 5 μm, thereby to form the negative compensation point without any overlapping region. As a result, it is able to provide a constant Cgs, thereby to prevent the occurrence of such display defects as flickering. In addition, as compared with the positive Cgs compensation scheme in the related art, it is unnecessary for the negative Cgs compensation scheme to provide any additional compensation area. Further, it is able for the negative Cgs compensation scheme to increase the aperture ratio of the pixel. This negative Cgs compensation scheme may be applied to a small-size display device with a high pixel per inch (PPI).

Figure 5:
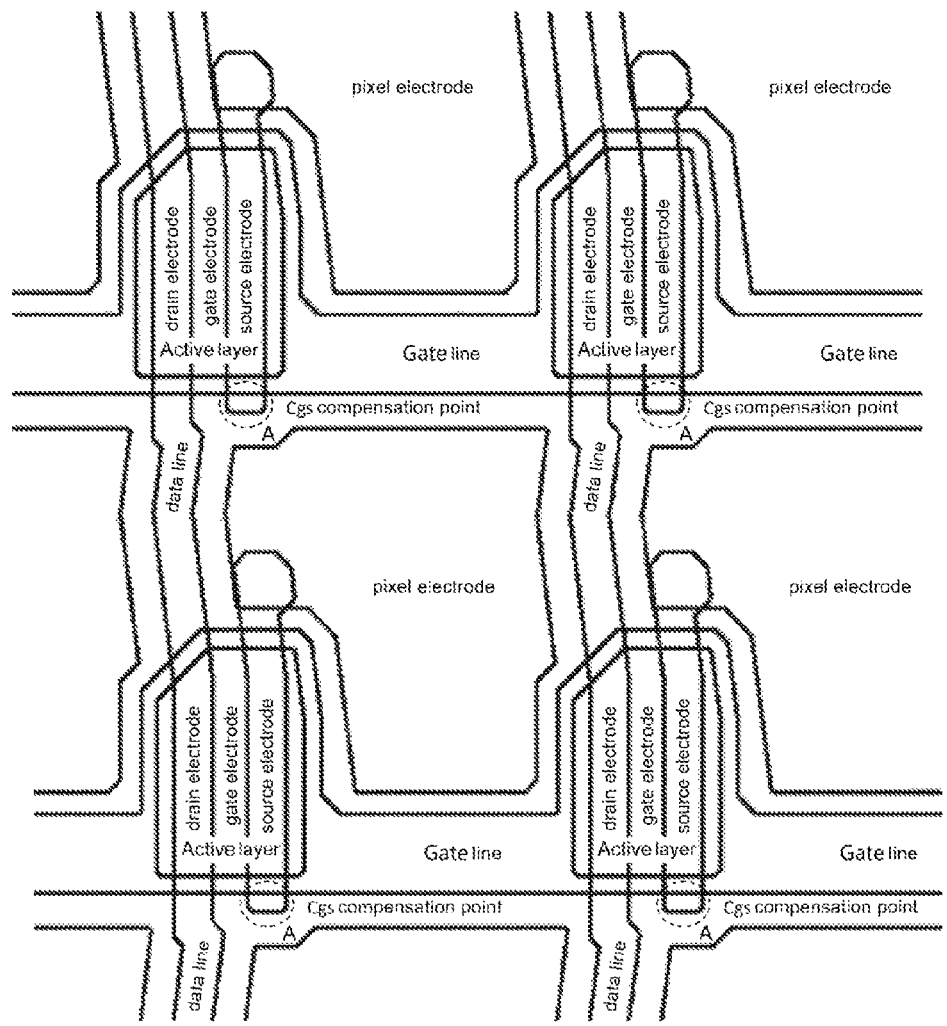
FIG. 5 is a schematic view showing an array substrate where source electrodes on the array substrate extend parallel to data lines according to one embodiment of the present disclosure.

FIG. 5 shows an array substrate. The source electrodes and the drains electrodes on the array substrate extend parallel to the data lines.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. An array substrate, comprising a plurality of pixel units, wherein each pixel unit includes only one thin film transistor (TFT), wherein a gate electrode, a drain electrode, and a source electrode of the TFT are arranged on a base substrate of the array substrate,
the source electrode has a first end connected to a pixel electrode on the array substrate, and the source electrode has a second end opposite to the first end;
a tip of the second end is provided with an extension portion;
an orthogonal projection of the extension portion onto the base substrate extends beyond an orthogonal projection of the gate electrode onto the base substrate;
the drain electrode is formed at a layer identical to the source electrode and a data line; and
the drain electrode is connected to, and extends in a direction substantially identical to, the data line, and the source electrode extends in a direction substantially parallel to the data line.

2. The array substrate according to claim 1, wherein the source electrode is of a strip-like shape.

3. The array substrate according to claim 1, wherein the extension portion has a length within a range from 1 μm to 5 μm.

4. The array substrate according to claim 3, wherein the extension portion has a length of 1.5 μm.

5. The array substrate according to claim 1, wherein the extension portion has a width substantially identical to a width of the source electrode.

6. A display device comprising the array substrate according to claim 1.

7. The array substrate according to claim 2, wherein the extension portion has a length within a range from 1 μm to 5 μm.

8. The array substrate according to claim 2, wherein the extension portion has a width substantially identical to a width of the source electrode.

9. A method for manufacturing an array substrate, wherein the array substrate comprises a plurality of pixel units, each pixel unit includes only one thin film transistor (TFT), the method comprising steps of:
forming a gate electrode of the TFT on a base substrate;
forming (i) a drain electrode of the TFT, (ii) a data line connected to, and extending in a direction substantially identical to, the drain electrode, and (iii) a source electrode of the TFT at an identical layer;
wherein the source electrode has a first end connected to a pixel electrode and a second end opposite to the first end;
the source electrode has an extension portion on the gate electrode, the extension portion is provided at a tip of the second end;
an orthogonal projection of the extension portion onto the base substrate extends beyond an orthogonal projection of the gate electrode onto the base substrate; and
the source electrode extends in a direction substantially parallel to the data line.

10. The method according to claim 9, wherein the extension portion has a length within a range from 1 μm to 5 μm.

11. The method according to claim 10, wherein the extension portion has a length of 1.5 μm.

* * * * *